US008255839B2

(12) United States Patent
Ivaldi

(10) Patent No.: US 8,255,839 B2
(45) Date of Patent: Aug. 28, 2012

(54) SECURING AUTHENTICITY OF INTEGRATED CIRCUIT CHIP

(75) Inventor: Juan Ivaldi, Redding, CT (US)

(73) Assignee: ASML Holding N.V., Veldhoven (NL)

( * ) Notice: Subject to any disclaimer, the term of this patent is extended or adjusted under 35 U.S.C. 154(b) by 727 days.

(21) Appl. No.: 12/250,740

(22) Filed: Oct. 14, 2008

(65) Prior Publication Data
US 2009/0100392 A1 Apr. 16, 2009

Related U.S. Application Data

(60) Provisional application No. 60/980,341, filed on Oct. 16, 2007.

(51) Int. Cl.
*G06F 17/50* (2006.01)

(52) U.S. Cl. ............ 716/51; 716/50; 716/52; 716/53; 716/54; 716/55

(58) Field of Classification Search .............. 716/50, 716/51, 52, 53, 54, 55
See application file for complete search history.

(56) References Cited

U.S. PATENT DOCUMENTS

| 6,442,525 | B1 * | 8/2002 | Silverbrook et al. | 705/50 |
| 2003/0204743 | A1 * | 10/2003 | Devadas et al. | 713/200 |
| 2005/0218236 | A1 * | 10/2005 | Silverbrook et al. | 235/494 |
| 2006/0153380 | A1 | 7/2006 | Gertner | |
| 2007/0113159 | A1 | 5/2007 | Lakkis | |
| 2009/0220789 | A1 * | 9/2009 | DeSimone et al. | 428/402 |

OTHER PUBLICATIONS

"High Performance Microchip Supply", Defense Science Board Task Force, Office of the Under Secretary of Defense for Acquisition, Technology, and Logistics Washington, DC, Feb. 2005, 118 pgs.
"Trust in Integrated Circuits (TIC)", DARPA/MTO, BAA07-24, posted Mar. 7, 2007, 6 pgs.
Ben-Artzi, Amir, "Fake components delay designs in Israel", EETimes, Mar. 29, 2007, 2pgs., http://www.eetimes.com/showArticle.jhtml?articleID=198701043.

\* cited by examiner

*Primary Examiner* — Vuthe Siek
*Assistant Examiner* — Brian Ngo
(74) *Attorney, Agent, or Firm* — Sterne, Kessler, Goldstein & Fox P.L.L.C

(57) ABSTRACT

A system and method are provided for securely manufacturing a device at a foundry. For example, an integrated circuit chip may be securely fabricated at an untrusted foundry by later verifying authenticity of the integrated circuit chip based on a valid usage of an original source code file associated with a semiconductor manufacturing process of the integrated circuit chip. The integrated circuit chip may be authenticated by matching a first set of unique daughter codes generated during fabrication with a second set of unique daughter codes generated independently by some entity other than the foundry. In this way, a trusted electronics integrator may compare the first and second unique daughter codes to non-destructively determine whether the integrated circuit chip is a trusted device or a tampered device.

20 Claims, 7 Drawing Sheets

SECURING AUTHENTICITY OF INTEGRATED CIRCUIT CHIP

CROSS REFERENCE TO RELATED APPLICATIONS

This application claims priority under 35 U.S.C. §119(e) to U.S. Provisional Patent Application No. 60/980,341, filed Oct. 16, 2007, which is incorporated by reference herein in its entirety.

BACKGROUND

1. Field of the Invention

The present invention generally relates to a lithographic apparatus and a system and method for non-destructive testing of trusted integrated circuits fabricated in an untrusted foundry to secure authenticity of the integrated circuits.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. Such a lithographic apparatus can be mask-based or maskless. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can be a patterning array that comprises an array of individually controllable elements. The pattern can be changed more quickly and for less cost in such a system compared to a mask-based system.

Lithographic apparatus designed to expose a substrate of an IC can provide an exposure region that covers a full dimension of the substrate, or covers a portion of the dimension (for example half of the width). The substrate can be scanned underneath the exposure region, while the mask or reticle is synchronously scanned through a beam. In this way, the pattern is transferred to the substrate. If the exposure region covers the full dimension of the substrate then exposure can be completed with a single scan. If the exposure region covers, for example, half of the width of the substrate, then the substrate can be moved transversely after the first scan, and a further scan is typically performed to expose the remainder of the substrate.

IC's made in semiconductor foundries are vulnerable to tampering. Tampering can result in unexpected failures in the field use of IC's, which is unacceptable particularly in critical areas such as medical electronics and/or military applications. Reports from U.S. government offices document the problem of IC tampering in untrusted, especially off-shore, foundries. See, for example, February 2005 report from the Defense Science Board Task Force on High Performance Microchip Supply. A recent broad agency announcement from DARPA highlight the need for solutions—DARPA/MTO, BAA 07-24 "Trust in Integrated Circuits", April 2007. Such security needs transcend government interests and also affect commercial operations, as noted in "Fake components delay designs in Israel," EETimes, March 2007, URL: http://www.eetimes.com/showArticle.jhtml?articleID=198701043.

Typically, in maskless lithography, original circuit pattern data is stored in a Graphic Data System (GDS or GDS II) in the form of image data. In an untrusted foundry, lack of control could result in a substitute GDS file or mask to be inserted into the process, thereby leading to a tampered with final IC. Sufficient controls to guard against intrusive patterns, counterfeit copies of IC designs, or unwanted alterations may not be in place at all foundries. The burdens required to insist on stricter controls on protocol are likely cost prohibitive.

Conventional systems may merely rely on the trustworthiness of a foundry when determining whether or not an IC or a batch of ICs is to be trusted. Alternatively, some systems test sample ICs using reverse engineering or by physically taking the IC apart layer by layer. With these conventional testing standards there may not be assurety if each and every IC will be authentic. Further, these methods are inherently destructive by nature leading to the test IC becoming unusable after the test is carried out with no 100% guarantee that any other IC in the lot will be authentic. In other words, trust cannot be added to ICs after fabrication and mere electrical testing and/or reverse engineering cannot be relied upon to detect undesired alterations in ICs on an IC-by-IC basis.

SUMMARY

In one or more embodiments, a system and method are provided that test ICs in a non-destructive manner when those ICs are fabricated in an untrusted foundry. Additionally, or alternatively, a secure method of detecting counterfeit ICs and electronic devices is also provided when ICs are manufactured abroad at untrusted locations.

According to one embodiment of the invention, a process by which a lithography tool could be used to improve the level of trust in the IC even when made at an untrusted foundry is described. The lithography tool is used to print unique codes directly into the silicon which can later be read non-destructively to verify the chip origin and design. This can be done with mask based or maskless lithography tools. By embedding the security process within the maskless tool software and architecture, the process becomes tamper-proof. As such, secure printing approaches may offer the needed impetus to gain greater customer interest and support for maskless technology.

In another embodiment of the present invention, a set of daughter codes are generated from an original source GDS file or an original template that describes the device to be fabricated or manufactured. These daughter codes are then imprinted as patterns on one or more physical areas of the IC or the device during manufacturing. The feature size of the daughter codes printed on the IC, can be, for example, an order larger than the various components' feature size on the IC. In an independent testing and system integration facility (also referred to as a trusted integrator), these patterns can be read out non-destructively from every individual IC or device. Finally, the read out pattern is compared with a second set of daughter codes generated from the same GDS file as was used to manufacture the IC or the device in the untrusted foundry. If the patterns match, the IC or the device is declared trusted. Alternatively, if there is a mismatch in the daughter code patterns, the IC is declared as defective or untrusted.

Further embodiments, features, and advantages of the present inventions, as well as the structure and operation of the various embodiments of the present invention, are described in detail below with reference to the accompanying drawings.

BRIEF DESCRIPTION OF THE DRAWINGS

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
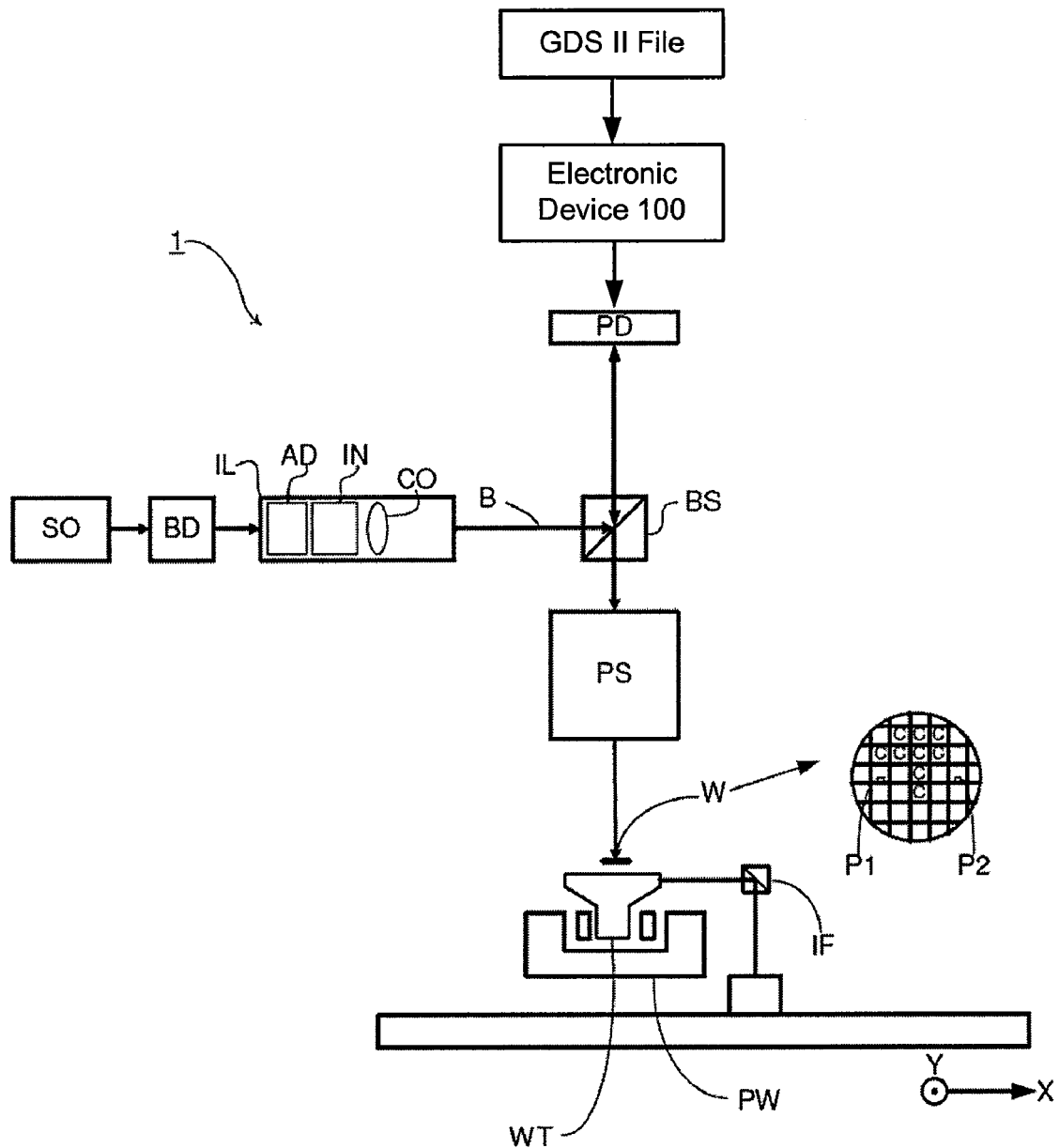
FIGS. 1 and 2 depict lithographic apparatus.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others.

Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

FIG. 1 schematically depicts a lithographic apparatus 1 of one embodiment of the invention. The apparatus comprises an illumination system IL, a patterning device PD, a substrate table WT, and a projection system PS. The illumination system (illuminator) IL is configured to condition a radiation beam B (e.g., UV radiation).

It is to be appreciated that, although the description is directed to lithography, the patterned device PD can be formed in a display system (e.g., in a LCD television or projector), without departing from the scope of the present invention. Thus, the projected patterned beam can be projected onto many different types of objects, e.g., substrates, display devices, etc.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The illumination system can include various types of optical components, such as refractive, reflective, magnetic, electromagnetic, electrostatic or other types of optical components, or any combination thereof, for directing, shaping, or controlling radiation.

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device; however it is to be appreciated that a static pattern device can also be used without departing from the scope of the present invention.

It should be noted that the pattern imparted to the radiation beam cannot exactly correspond to the desired pattern in the target portion of the substrate, for example if the pattern includes phase-shifting features or so called assist features. Similarly, the pattern eventually generated on the substrate cannot correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Figure 6:
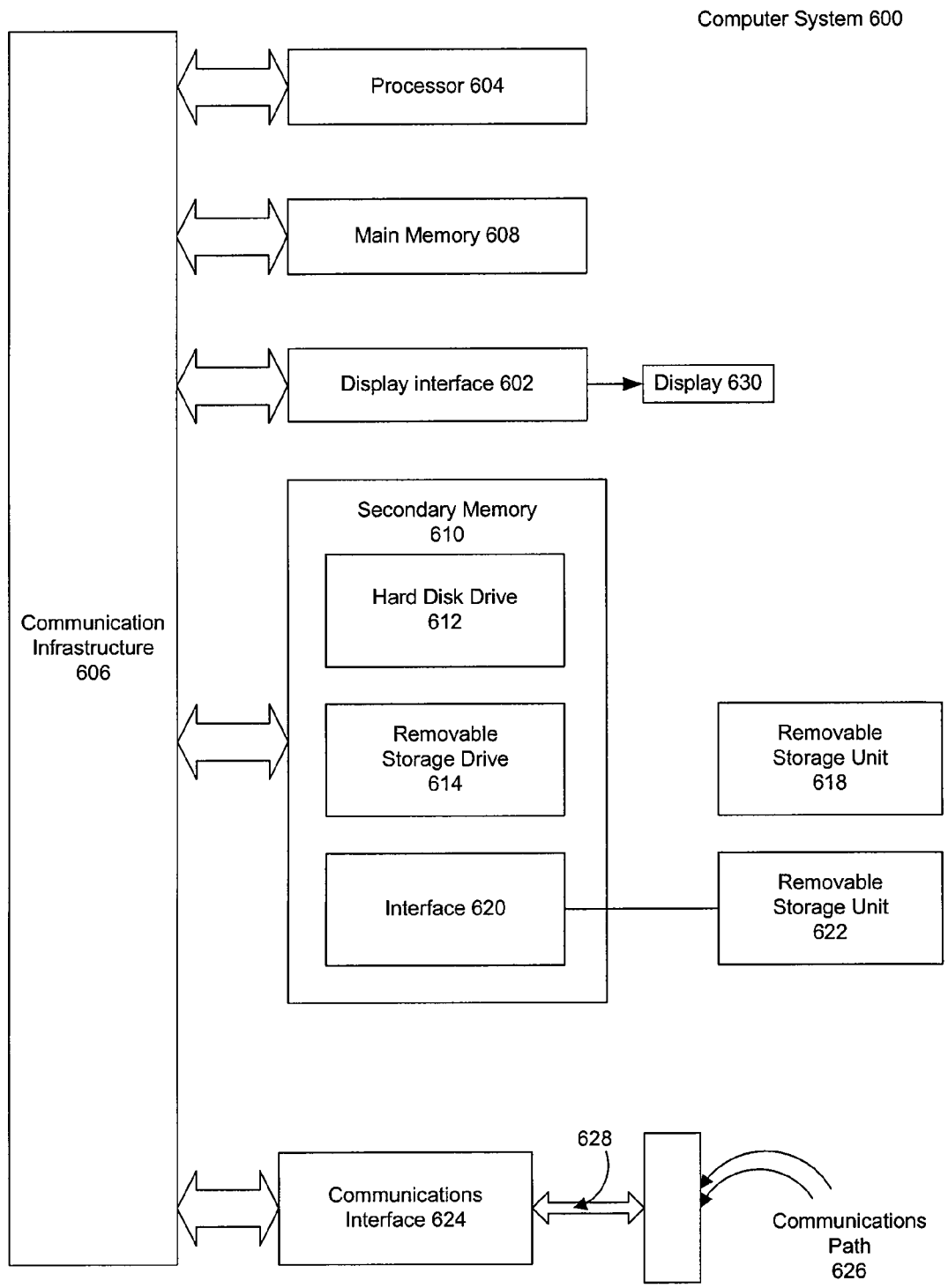
FIG. 6 depicts an exemplary computer system.

Patterning device PD may be programmable with the aid of an electronic device 100 (e.g., a controller, a computer, a code generator, etc.) in order to produce different types of patterns (e.g., a functional layer or a unique code). Programmability of patterning device PD may be implemented using, for example, a computer system 600 as shown in FIG. 6. Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Additionally, or alternatively, the pattern may be one or more unique codes (e.g., daughter codes) that are formed on the substrate W, described in more detail below. The patterns may be formed through controlling of electronic device 100 based on received GDS II files, described in more detail below.

Examples of such patterning devices include reticles, programmable mirror arrays, laser diode arrays, light emitting diode arrays, grating light valves, and LCD arrays.

The patterning device may comprise a plurality of programmable elements (e.g., all the devices mentioned in the previous sentence except for the reticle), are collectively referred to herein as "contrast devices." The patterning device comprises at least 10, at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In one example, such as the embodiment depicted in FIG. 1, the substrate W has a substantially circular shape, optionally with a notch and/or a flattened edge along part of its perimeter. In another example, the substrate has a polygonal shape, e.g., a rectangular shape.

Examples where the substrate has a substantially circular shape include examples where the substrate has a diameter of at least 25 mm, at least 50 mm, at least 75 mm, at least 100 mm, at least 125 mm, at least 150 mm, at least 175 mm, at least 200 mm, at least 250 mm, or at least 300 mm. Alternatively, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, at least 2 sides or at least 3 sides, of the substrate has a length of at least 5 cm, at least 25 cm, at least 50 cm, at least 100 cm, at least 150 cm, at least 200 cm, or at least 250 cm.

At least one side of the substrate has a length of at most 1000 cm, at most 750 cm, at most 500 cm, at most 350 cm, at most 250 cm, at most 150 cm, or at most 75 cm.

In one example, the substrate W is a wafer, for instance a semiconductor wafer.

The wafer material can be selected from the group consisting of Si, SiGe, SiGeC, SiC, Ge, GaAs, InP, and InAs. The wafer can be: a III/V compound semiconductor wafer, a silicon wafer, a ceramic substrate, a glass substrate, or a plastic substrate. The substrate can be transparent (for the naked human eye), colored, or absent a color.

The thickness of the substrate can vary and, to an extent, can depend on the substrate material and/or the substrate dimensions. The thickness can be at least 50 µm, at least 100 µm, at least 200 µm, at least 300 µm, at least 400 µm, at least 500 µm, or at least 600 µm. Alternatively, the thickness of the substrate can be at most 5000 µm, at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array to form the secondary sources and to image spots onto the substrate. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of individually controllable elements in the patterning device is equal to or greater than the number of focusing elements in the array of focusing elements. One or more (e.g., 1,000 or more, the majority, or each) of the focusing elements in the array of focusing elements can be optically associated with one or more of the individually controllable elements in the array of individually controllable elements, with 2 or more, 3 or more, 5 or more, 10 or more, 20 or more, 25 or more, 35 or more, or 50 or more of the individually controllable elements in the array of individually controllable elements.

The MLA can be movable (e.g., with the use of one or more actuators) at least in the direction to and away from the substrate. Being able to move the MLA to and away from the substrate allows, e.g., for focus adjustment without having to move the substrate.

Figure 2:
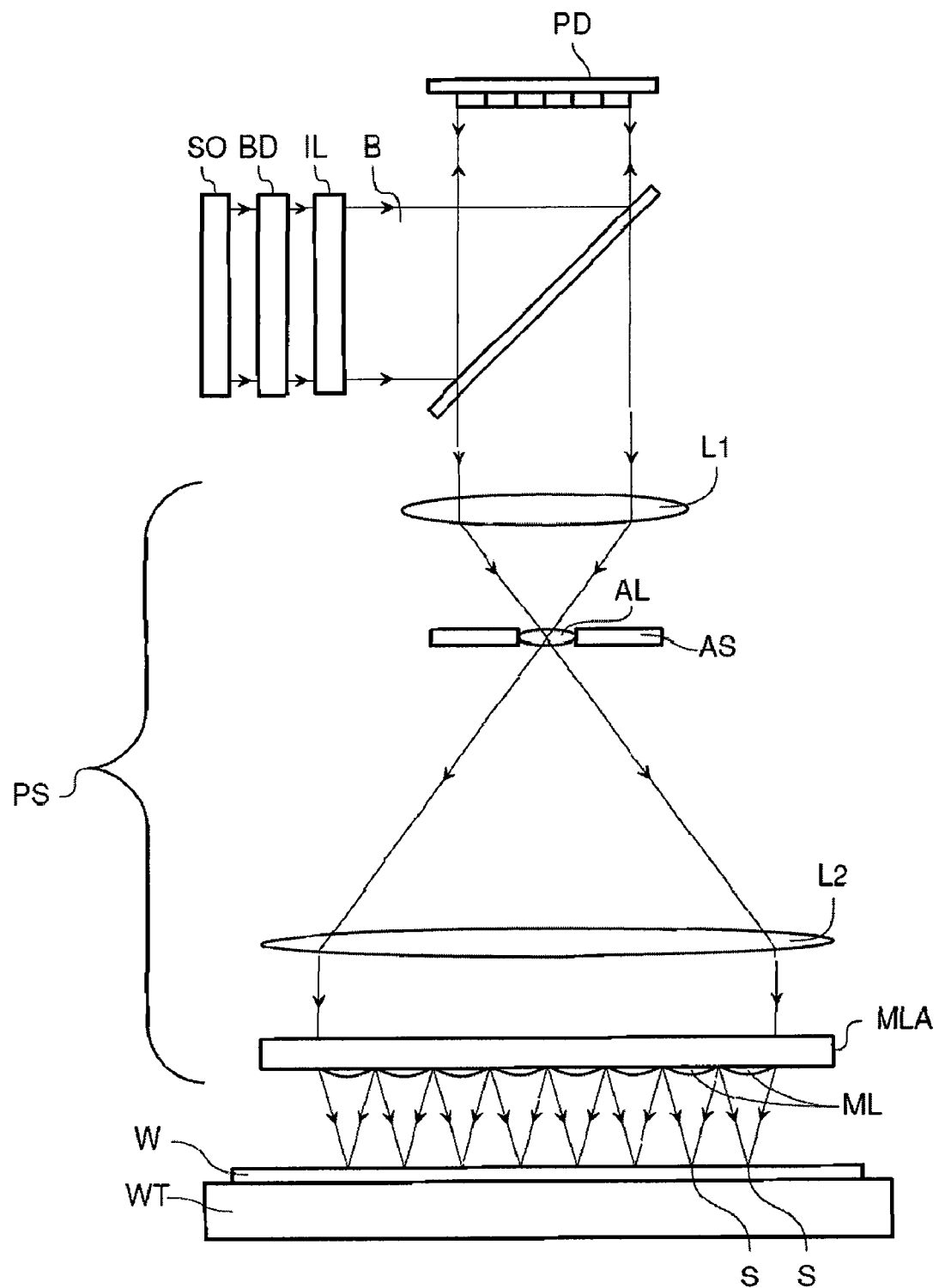

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The radiation source provides radiation having a wavelength of at least 5 nm, at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation can have a wavelength including 436 nm, 405 nm, 365 nm, 355 nm, 248 nm, 193 nm, 157 nm, and/or 126 nm.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage cannot be present. A similar system can also be used to position the array of individually controllable elements. It will be appreciated that the beam B can be alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation can be directed at the patterning device at an angle between 0 and 90°, between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 cannot be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). At least 3, at least 4 radiation intensity values, at least 8 radiation intensity values, at least 16 radiation intensity values, at least 32 radiation intensity values, at least 64 radiation intensity values, at least 128 radiation intensity values, or at least 256 different radiation intensity values can be projected onto the substrate.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. The radiation dose profile can have at least 2 desired dose levels, at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses ML in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
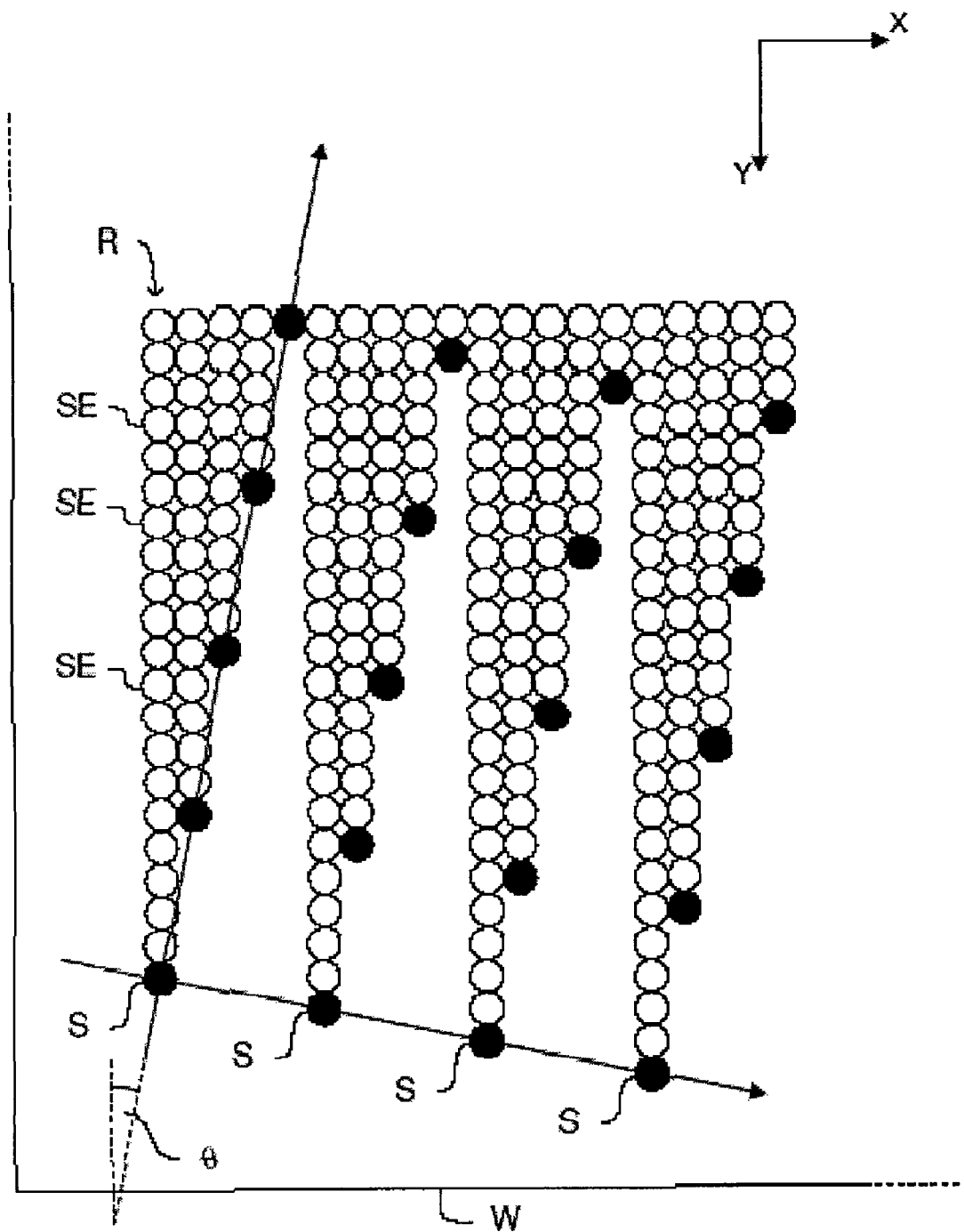
FIG. 3 depicts a mode of transferring a pattern to a substrate.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle $\theta$ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. The angle $\theta$ can be at most 20°, at most 10°, at most 5°, at most 3°, at most 1°, at most 0.5°, at most 0.25°, at most 0.10°, at most 0.05°, or at most 0.01°. Alternatively, the angle $\theta$ is at least 0.001°.

Example Embodiments

Generally, a system and method are provided for nondestructively testing an IC device manufactured at a foundry. For example, an integrated circuit chip may be securely fabricated at an untrusted foundry by later verifying authenticity of the integrated circuit chip based on a valid usage of an original source code file associated with a semiconductor manufacturing process of the integrated circuit chip. The integrated circuit chip may be authenticated by matching a first set of unique daughter codes generated during fabrication with a second set of unique daughter codes generated independently by some entity other than the foundry. In this way, a trusted electronics integrator may compare the first and second unique daughter codes to nondestructively determine whether the integrated circuit chip is a trusted device or a tampered device.

Figure 4:
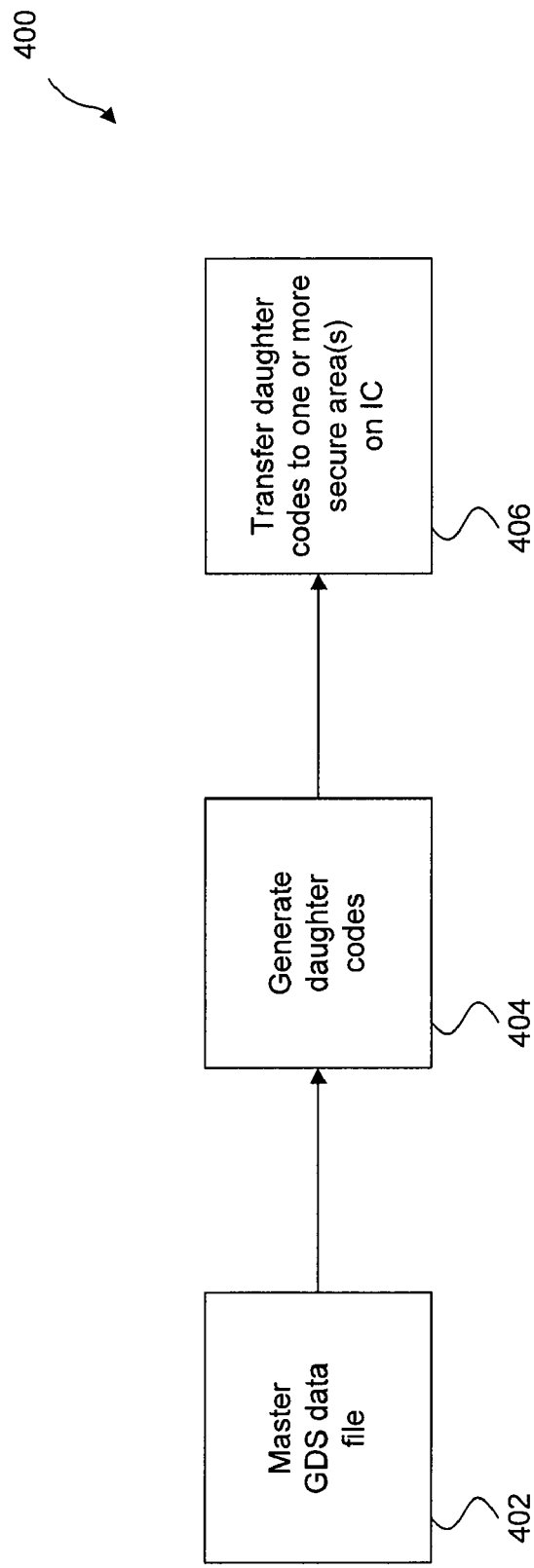
FIG. 4 depicts a general method of generating daughter codes from a GDS file.

FIG. 4 depicts an exemplary general flowchart for transferring a set of daughter codes as pattern(s) onto one or more physical area(s) on an IC. In step 402 of flowchart 400, a master GDS data or image file is obtained from a trusted source e.g., a layout designer of the IC circuit pattern. The master GDS file is then processed mathematically to generate one or more daughter code sets, as shown in step 404. Such mathematical processing involves, for example, unique number sequences derived by specially developed software.

Then, as shown in step 406, these daughter code sets are transferred onto a secure area on the IC during manufacturing of the IC, using, e.g., a lithographic apparatus and process as described above. The generation of daughter codes results from a mathematical transform of the original GDS data. An exemplary approach is to use a frequency domain transform known as a wavelet transform. Although similar in nature to a Fourier transform (FT), wavelet functions are distinguished from other transformations in that they not only dissect signals into their component frequencies, they also vary the scale at which the component frequencies are analyzed. They are a discrete non-infinite series so their representation is sparse. When compared with traditional transformations such as the FT, the ability to vary the scale of the function as it addresses different frequencies makes wavelets better suited to data with discontinuities such as those found in mask designs.

Because the original data can be represented in terms of a wavelet expansion (using coefficients in a linear combination of the wavelet functions), data operations can be performed using just the relevant wavelet coefficients. By appropriate selection of the best adapted wavelet series to the mask data, and/or truncation of the coefficients below a threshold, a sparse representation of the original data is produced. The reduced sparse matrix of coefficients becomes the daughter code.

As is well known in the art, a GDS file comprises circuit pattern data, for example in the form of an image, associated code, and/or image file metadata. The daughter codes are mathematically derived from such a circuit pattern data by processing, for example, one or more of in-built flags, data variables and identifiers, and subroutine or function input and output values. These codes are transferred by lithographic printing onto a predetermined portion of the IC die area known as a security stamp area. It is to be noted that although the security stamp area is being referred to as one physical area on the IC die, the daughter codes can also be distributed all throughout the IC die area. Further, the daughter codes can either be generated prior to mask creation and written on to the mask or they can be generated in a real-time direct-write maskless as a software associated with the lithographic machine and running real-time while the die is being exposed for circuit patterns. Using a direct-write maskless tool may allow for reduction in the probability of tampering the circuit pattern data stored in the GDS file since the system that generates the daughter codes is built into the lithography tool. Furthermore, since the daughter code pattern data is software generated and sent to MLA as control signals to modify the positions (using, for example, actuators) of individual elements of the MLA corresponding to a composite pattern data (including image pattern data and daughter code pattern data), no additional resources or protocol changes, may be required at the foundry where the IC die is being fabricated.

Figure 5:
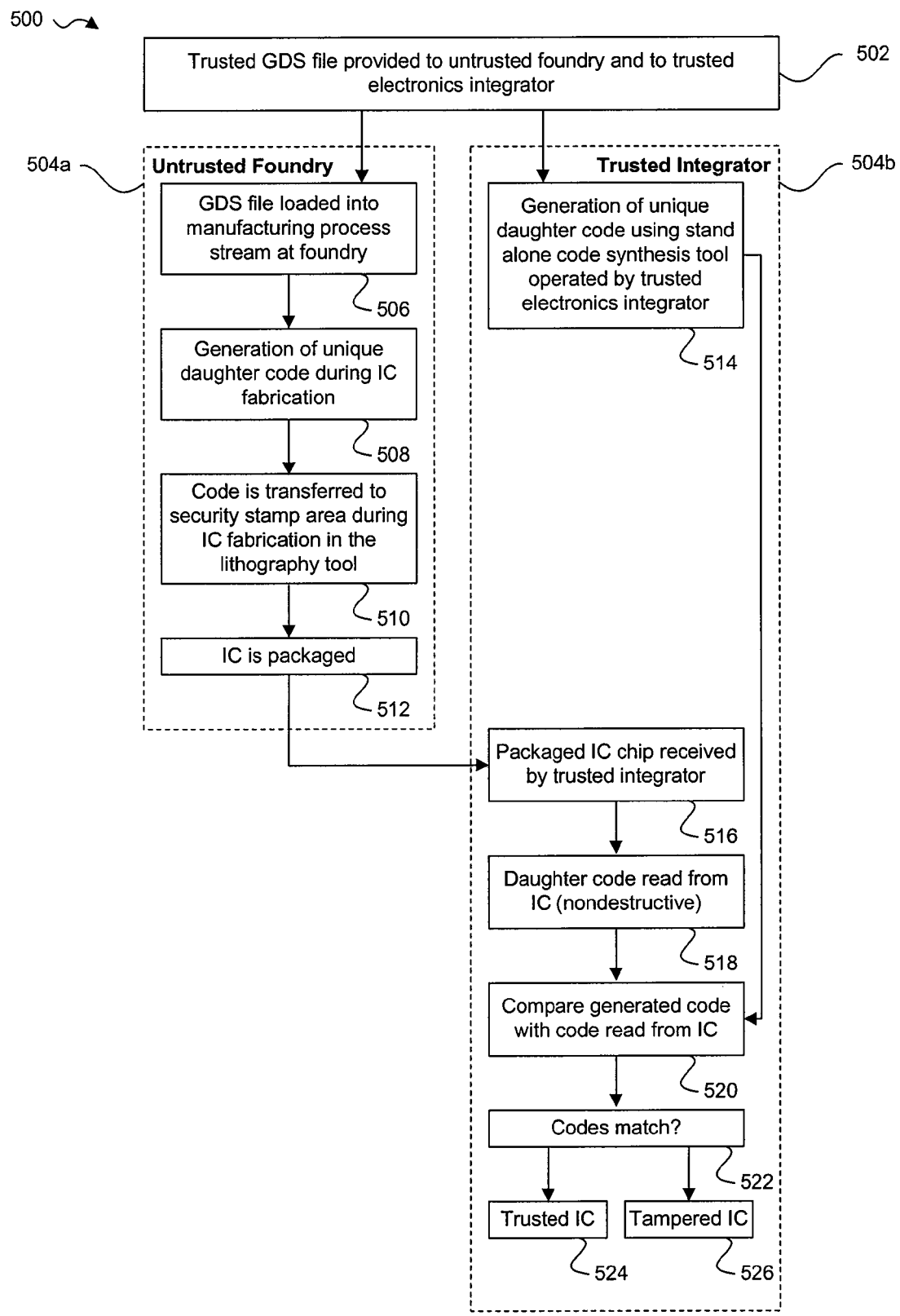
FIG. 5 depicts a detailed method of non-destructively testing an IC device at a trusted integrator.

Referring to FIG. 5, an exemplary method 500 to verify ICs manufactured at an untrusted foundry is shown. Method 500 illustrates, in step 502, an original and trusted master GDS file provided to an untrusted foundry and to a trusted electronic integrator. Portions 504a and 504b show the different steps that may occur at the untrusted foundry and the trusted integrator site, respectively.

In portion 504a of the method 500, once the GDS file is sent to the untrusted foundry, the GDS file is loaded into the manufacturing process stream of the foundry, as shown in step 506 according to one illustrated embodiment of the present invention. During step 506, the substrate is exposed with the circuit patterns and daughter code pattern by means of a patterned beam, for example as described above with respect to FIGS. 1-3. At this point, someone or some process (e.g., an automatic computer generated routine) in the untrusted foundry may intentionally or unintentionally tamper or corrupt the original GDS file leading to a defective or tampered IC being manufactured. To avoid this, daughter codes derived mathematically from the GDS file may be imprinted onto the secure area of the IC. As shown in step 508, daughter codes may be generated from the original GDS file during IC fabrication. These daughter codes may be unique codes and number sequences that can be derived from the GDS patent data using specially developed software. The generation of these codes may involve compression technique(s), and encryption methodology, and/or public and private key(s) to add a pre-set level of sensitivity to tampering. In one embodiment of the present invention, this functionality of the daughter codes may be implemented, for example, as a modified version of check sum that is typically used by software programmers to check data integrity. These daughter codes may represent in a unique way the parent GDS data so that if the parent GDS data changes in any way, a different and unique daughter code is derived, and thereby a different and unique daughter code pattern is transferred onto a secure stamp area of the IC. During verification, if the GDS data file gets corrupted or is tampered with, the daughter code that was generated from that corrupt GDS file would be different from a second set of daughter codes generated independently from the original master GDS file provided to the untrusted foundry, as shown in step 502.

Once the daughter codes have been generated, they are transferred to one or more physical areas on the IC. These physical areas may be termed as security stamp areas. In step 510, the representation of daughter codes on the wafer is described according to one embodiment of the present invention. A suitable representation of the daughter code is manifested as a printable feature on the surface of the wafer or the IC die. The choice of a type of representation of the daughter code may be closely linked to the read out technology. For example, in one embodiment the patterns may be of the form of a bar code or a two-dimensional analog of a bar code. Alternatively or additionally, the patterns may be more complex areas of dots that can be read by an imager and subsequently decoded. Further still, the patterns may be completely passive or actively connected to a power source to make them readable. An example of an active pattern would be a resistive structure which when powered elevates slightly in temperature and becomes permanently visible to infrared (IR) light with a specially designed camera system. Active patterns may even involve transistors, which are turned ON or OFF depending on how the daughter codes are represented on the IC. Readout methods for such patterns may further include a microscope or microscopic diffraction techniques. Further still, such readout methods and means may be manual or automated, depending on specific needs. Alternatively, read-out patterns may be represented on the IC die by "lands" and "pits," as is well known to those skilled in the art of compact disk (CD) data recording and processing.

To create a pattern for the secure stamp area (which may be pre-defined), ideally software may be used to convert the daughter code into its representation and filed/compiled in a final form for printing in one embodiment of the present invention. In one embodiment, e.g., this conversion process may be performed prior to the creation of the mask with the secure stamp added during mask fabrication. Consistent with one embodiment of the present invention, a conventional code converter by using any one of the methods known to those skilled in the relevant art may convert the daughter code into a representation that is a suitable form for printing. Alternatively, in case of a maskless lithography system, such a representation can be provided within software that controls the maskless lithography system. Creation of the secure stamp pattern as part of the lithography step (and not elsewhere) may have a higher level of security because the code is generated within the system architecture of the lithography tool. This way, even if the GDS file is substituted or tampered at the input to the lithography tool, the security stamp would still reveal such a tampering at the time of inspection at trusted electronic integrator 504b.

Once the daughter code is represented on the IC, the IC is packaged using a suitable packaging apparatus and/or process, as shown in step 512. For example, the IC may be packaged at off-shore locations in various countries. Post packaging, ICs are shipped back to the target/source country from where they are forwarded to the trusted integrator 504b.

As noted earlier, trusted integrator 504b may deploy its own independent way for generating unique daughter codes according to one exemplary embodiment of the present invention. For example, generation of unique daughter codes may be accomplished by using stand alone code synthesis tools operated independently of the foundry at which the IC design was actually transferred to the substrate (step 514).

In step 516, packaged IC chip is received by the trusted integrator portion (or trusted integrator) 504b and the process of inspection may begin. In step 518, the daughter codes resident on an IC may be read out at the trusted integrator 504b. Consistent with one embodiment of the present invention, a conventional read out apparatus may use one of the methods known to those skilled in the pertinent art for reading the daughter codes from the surface of the wafer IC chip after the chip is completed in its final packaged form. Of course, a host of suitable technologies available or known to persons of ordinary skill in the art may be used to read out the daughter code pattern on the IC based on a specific application. For example, the trusted integrator 504b may employ means for reading these patterns through ceramic, plastic or other types of IC packaging well known to those skilled in the art. Such means involve, e.g., infrared (IR) imaging, acoustic microscopy, diffraction techniques, magnetic imaging, x-ray imaging, terahertz imaging, a combination thereof, and/or other present or future read-out technologies known or contemplated by one skilled in the art. In case of active daughter code patterns on the IC chip, trusted integrator 504b may also utilize suitable ways to apply voltages during inspection to make the active daughter code patterns on the IC radiate electromagnetic radiation which is then read by a detecting mechanism, e.g., a sensor or a sensor array. Further, these readout technologies may be used in combination with either active or passive representations of the daughter code on the IC.

Trusted integrator 504b may comprise a standalone system that may receive the GDS file corresponding to an IC and convert it into daughter code for data comparison. The standalone system may perform substantially similar calculations as those performed at the time of creation of the IC design. In step 520, trusted integrator 504*b* may then compare the daughter codes generated independently in step 514 to those resident as daughter code patterns on the packaged IC received in step 516. In step 522, if the daughter codes generated by the trusted integrator 504*b* match those daughter codes resident on the IC, the IC is determined to be a trusted IC, as shown in step 524. If not, the IC is determined to be rejected as a tampered IC, as shown in step 526. In various embodiments, such selection and rejection mechanisms can be automated, manual, or an appropriate combination of the two, depending on specific applications.

Figure 7:
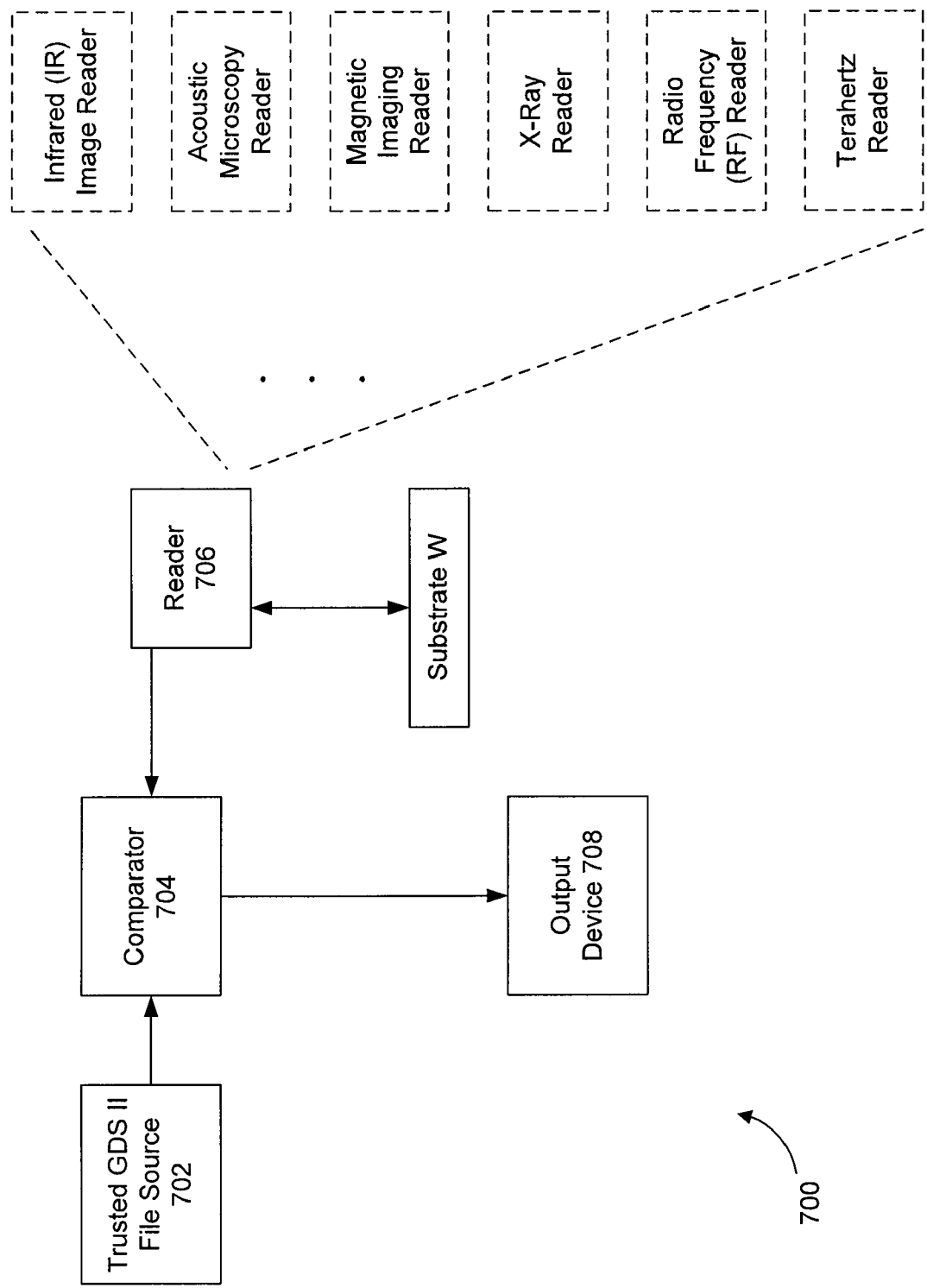
FIG. 7 depicts a sub-module of a lithographic apparatus.

FIG. 7 depicts yet another embodiment of the present invention in which a sub-module 700 of the lithographic apparatus is shown. In one example, sub-module 700 may be installed at trusted integrator 504*b*'s site. Sub-module 700 includes a file source 702 (e.g., a GDSII file source), a comparator 704, a reader 706, and an output device 708. Reader 706 may be (as shown), but is not limited to, for example, an infrared (IR) image reader, an acoustic microscopy reader, a magnetic imaging reader, X-ray image reader, a radio frequency (RF) reader, a terahertz image reader, or a combination thereof, and/or other present or future read-out technologies known or contemplated by one skilled in the art. Reader 706 reads a code from substrate W. The code may be a unique code (e.g., a daughter code). Comparator 704 compares the read code with the GDSII file source to produce a comparison result. For example, this may be done as described above with respect to method 500. In one embodiment, the comparison result is transmitted to output device 708 to be used for selecting or rejection the IC of which substrate W is a part of. Output device 708 may be an audio, visual, or any other form of output device well known to those skilled in the art.

Therefore, using various embodiments of the present invention, ICs can be non-destructively tested for tampering on a chip-by-chip basis, which is significantly different compared to the conventional foundry-by-foundry or batch-by-batch basis conventional performed, thereby providing a higher flexibility and accuracy in the IC testing process. By securing the printing and the exposure step during the manufacture of the IC through the use of daughter code patterns, ICs fabricated at untrusted foundries may also be fully trusted.

Although specific reference can be made in this text to the use of lithographic apparatus in the manufacture of a specific device (e.g., an IC or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, and the daughter code patterns could be distributed within those layers in a random or deterministic manner e.g., in a thin film transistor layer and/or a color filter layer.

Although specific reference is made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured. Further still, the use of various embodiments of the invention may also be applicable in other forms of lithography or any combination thereof, for example but not limited to, electron-beam lithography, nano-imprint lithography, X-ray lithography, interference lithography, extreme ultra-violet lithography, or other present or future lithography techniques.

Exemplary Computer System

Embodiments of the present invention may also be implemented using hardware, software or a combination thereof, and may be implemented in one or more computer systems or other processing systems. However, the manipulations performed by the present invention were often referred to in terms, such as comparing or checking, which are commonly associated with mental operations performed by a human operator. No such capability of a human operator is necessary, or desirable in most cases, in any of the operations described herein, which form a part of the present invention. Rather, the operations are machine operations. Useful machines for performing the operations in the present invention may include general-purpose digital computers or similar devices.

In fact, in accordance with an embodiment of the present invention, the present invention is directed towards one or more computer systems capable of carrying out the functionality described herein. An example of the computer systems includes a computer system 600, which is shown in FIG. 6.

Computer system 600 includes one or more processors, such as a processor 604. Processor 604 is connected to a communication infrastructure 606, for example, a communications bus, a cross over bar, a network, and the like. Various software embodiments are described in terms of this exemplary computer system 600. After reading this description, it will become apparent to a person skilled in the relevant art(s) how to implement the present invention using other computer systems and/or architectures.

Computer system 600 includes a display interface 602 that forwards graphics, text, and other data from communication infrastructure 606 (or from a frame buffer which is not shown in FIG. 6) for display on a display 630.

Computer system 600 also includes a main memory 608, such as random access memory (RAM), and may also include a secondary memory 610. Secondary memory 610 may include, for example, a hard disk drive 612 and/or a removable storage drive 614, representing a floppy disk drive, a magnetic tape drive, an optical disk drive, etc. Removable storage drive 614 reads from and/or writes to a removable storage unit 618 in a well known manner. Removable storage unit 618 represents a floppy disk, magnetic tape, optical disk, and the like. Removable storage unit 618 may be read by and written to by removable storage drive 614. As will be appreciated, removable storage unit 618 includes a computer usable storage medium having stored therein, computer software and/or data.

In accordance with various embodiments of the present invention, secondary memory 610 may include other similar devices for allowing computer programs or other instructions to be loaded into computer system 600. Such devices may include, for example, a removable storage unit such as removable storage unit 618, and an interface. Examples of such may include a program cartridge and cartridge interface (such as that found in video game devices), a removable memory chip (such as an erasable programmable read only memory (EPROM), or programmable read only memory (PROM)) and associated socket, and other removable storage units and interfaces, which allow software and data to be transferred from removable storage unit 618 to computer system 600.

Computer system 600 may also include a communication interface 624. Communication interface 624 allows software and data to be transferred between computer system 600 and external devices. Examples of communication interface 624 may include a modem, a network interface (such as an Ethernet card), a communications port, a Personal Computer Memory Card International Association (PCMCIA) slot and card, and the like. Software and data transferred via communication interface 624 are in the form of a plurality of signals, hereinafter referred to as signals 638, which may be electronic, electromagnetic, optical or other signals capable of being received by communication interface 624. Signals 638 are provided to communication interface 624 via a communication path (e.g., channel) 626. Communication path 626 carries signals 638 and may be implemented using wire or cable, fiber optics, a telephone line, a cellular link, a radio frequency (RF) link and other communication channels.

In this document, the terms "computer program medium" and "computer usable medium" are used to generally refer to media such as removable storage drive 614, a hard disk installed in hard disk drive 612, signals 638, and the like. These computer program products provide software to computer system 600. The present invention is directed to such computer program products.

Computer programs (also referred to as computer control logic) are stored in main memory 608 and/or secondary memory 610. Computer programs may also be received via communication interface 624. Such computer programs, when executed, enable computer system 600 to perform the features of the present invention, as discussed herein. In particular, the computer programs, when executed, enable processor 604 to perform the features of the present invention. Accordingly, such computer programs represent controllers of computer system 600.

In accordance with an embodiment of the present invention, where the present invention is implemented using software, the software may be stored in a computer program product and loaded into computer system 600 using removable storage drive 614, hard disc drive 612 or communication interface 624. The control logic (software), when executed by processor 604, causes processor 604 to perform the functions of the present invention as described herein.

In another embodiment, the present invention is implemented primarily in hardware using, for example, hardware components such as application specific integrated circuits (ASICs). Implementation of the hardware state machine so as to perform the functions described herein will be apparent to persons skilled in the relevant art(s).

In yet another embodiment, the present invention is implemented using a combination of both the hardware and the software.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A method of manufacturing an integrated circuit device, the method comprising:
   receiving, using a processing device, a file source in a manufacturing process stream being used to fabricate the device at a foundry, wherein the file source includes data correlating to the device;
   generating, using the processing device, a first set of one or more codes from the data; and
   forming, using the processing device, the first set of one or more codes on one or more physical areas of a substrate of the device to secure authenticity thereof.

2. The method of claim 1, further comprising:
   sensing the one or more formed codes from the one or more physical areas in the device;
   generating a second set of one or more codes from the file source using an independent code synthesis tool; and
   comparing the first set of one or more codes with the second set of one or more codes to produce a comparison result.

3. The method of claim 2, further comprising:
   determining if the device is accepted or rejected based on the comparison result.

4. The method of claim 2, wherein the sensing is non-destructive, such that the device is fully functional after the sensing is performed.

5. The method of claim 2, wherein the sensing is performed using at least one of
   1. infrared imaging;
   2. acoustic microscopy reading;
   3. magnetic imaging;
   4. X-Ray reading;
   5. Radio Frequency (RF) reading; and
   6. terahertz reading.

6. A method for verifying a valid usage of an original source code file associated with a semiconductor manufacturing of a microelectronics device, the method comprising:
   generating, using a processing device, a first set of one or more daughter codes from the original source code file;
   forming, using a processing device, the first set of one or more daughter codes on one or more physical areas of a substrate of the microelectronics device;
   generating, using a processing device, a second set of one or more daughter codes from a trusted copy of the original source code file; and
   comparing, using a processing device, the first and second sets of one or more daughter codes to produce a comparison result that determines whether the microelectronics device is a trusted device or a tampered device.

7. The method of claim 6, further comprising:
   determining if the device is to be accepted or rejected based on the comparison result.

8. The method of claim 6, wherein the original source code file is a Graphic Data System (GDS) file.

9. A method for detecting tampering of a pattern file in a lithography process, the method comprising:
   generating, using a processing device, a first set of unique codes from the pattern file;
   forming, using a processing device, the first set of unique codes on a substrate of an integrated circuit during the lithography process;
   sensing, using a processing device, the first set of unique codes;

generating, using a processing device, a second set of unique codes from the mask pattern file;

comparing, using a processing device, the sensed first set of unique codes with the second set of unique codes to produce a comparison result.

10. The method of claim 9, further comprising:
rejecting the integrated circuit if the comparing step is unsuccessful.

11. The method of claim 9, wherein the sensing is non-destructive, such that the integrated circuit is fully functional after the sensing.

12. The method of claim 9, wherein the sensing is performed using at least one of
1. infrared imaging;
2. acoustic microscopy reading;
3. magnetic imaging;
4. X-Ray reading;
5. Radio Frequency (RF) reading; and
6. terahertz reading.

13. A lithography system, comprising:
an illumination system configured to produce a beam of radiation;
a pattern generating device configured to pattern the beam corresponding to a pattern source file;
a projection system configured to project the patterned beam onto a target portion of a substrate; and
a code generator configured to generate a first set of one or more unique codes from the pattern source file, wherein the first set of one or more unique codes are formed on a physical area of the substrate.

14. The lithography system of claim 13, wherein the substrate is used to form an integrated circuit and the lithography system further comprises:
a reader configured to read from the first set of one or more unique codes from the integrated circuit in a non-destructive manner; and
a comparator configured to compare the read first set of one or more unique codes with a second set of generated unique codes to produce a comparison result; and
wherein acceptance or rejection of the integrated circuit is based on the comparison result.

15. The lithography system of claim 14, wherein the reader is at least one of:

(a) an infrared image reader;
(b) an acoustic microscopy reader;
(c) a magnetic imaging reader;
(d) an X-Ray reader;
(e) a Radio Frequency (RF) reader; and
(f) a terahertz reader.

16. The lithography system of claim 13, wherein the pattern source file is a Graphic Data System (GDS) file.

17. The lithography system of claim 13, wherein the physical area is a secure area.

18. The lithography system of claim 13, wherein the codes are formed on one or more distributed physical areas on the substrate.

19. A computer program product comprising a non-transitory computer useable medium having a computer program logic recorded thereon for controlling at least one processor, the computer program logic comprising:
computer program code means for receiving a trusted pattern file source;
computer program code means for transferring the pattern file source into a manufacturing process stream;
computer program code means for generating a first set of unique codes from data in the pattern file source;
computer program code means for instructing a lithography apparatus to form the first set of unique codes on a substrate of an integrated circuit;
computer program code means for generating a second set of unique codes from data in the pattern file source independent of the first set of unique codes; and
computer program code means for comparing the first and second set of unique codes to produce a comparison result.

20. A non-transitory computer-readable medium containing instructions for controlling at least one processor by a method comprising:
receiving a file source in a manufacturing process stream, wherein the file source includes data correlating to the device;
generating a first set of one or more codes from the data; and
forming the first set of one or more codes on one or more physical areas of a substrate of the device.

* * * * *